United States Patent [19]
Farnworth et al.

[11] Patent Number: 5,940,277
[45] Date of Patent: Aug. 17, 1999

[54] SEMICONDUCTOR DEVICE INCLUDING COMBED BOND PAD OPENING, ASSEMBLIES AND METHODS

[75] Inventors: Warren M. Farnworth, Nampa; Walter L. Moden, Meridian; Larry D. Kinsman, Boise, all of Id.

[73] Assignee: Micron Technology, Inc., Boise, Id.

[21] Appl. No.: 09/002,063

[22] Filed: Dec. 31, 1997

[51] Int. Cl.⁶ .................................................... H05K 7/10
[52] U.S. Cl. .......................... 361/760; 361/748; 361/764; 361/767; 361/772; 361/820; 361/761; 361/784; 361/785; 257/678; 257/701; 257/779; 257/712; 257/784; 257/720; 257/730; 174/262; 174/260; 439/629; 439/638
[58] Field of Search .................................. 257/678, 701, 257/779, 685, 784, 712, 720, 730; 361/760, 748, 751, 762, 764, 767, 772, 779, 791, 820, 773, 761, 792, 784, 785; 439/629, 638; 174/262, 260, 52.4

[56] References Cited

U.S. PATENT DOCUMENTS

| | | |
|---|---|---|
| Re. 34,794 | 11/1994 | Farnworth . |
| 3,624,587 | 11/1971 | Conrad ....................................... 439/65 |
| 4,558,912 | 12/1985 | Coller et al. ............................ 439/246 |
| 4,967,262 | 10/1990 | Farnworth .............................. 257/678 |
| 5,352,851 | 10/1994 | Wallace et al. .......................... 174/52.4 |
| 5,417,580 | 5/1995 | Tsai .......................................... 439/328 |
| 5,444,304 | 8/1995 | Hara et al. . |
| 5,450,289 | 9/1995 | Kweon et al. . |
| 5,451,815 | 9/1995 | Taniguchi et al. . |
| 5,555,488 | 9/1996 | McLellan et al. ....................... 361/820 |
| 5,592,019 | 1/1997 | Ueda, et al. . |
| 5,593,927 | 1/1997 | Farnworth et al. . |
| 5,635,760 | 6/1997 | Ishikawa . |
| 5,708,297 | 1/1998 | Clayton .................................. 257/723 |

*Primary Examiner*—Leo P. Picard
*Assistant Examiner*—David Foster
*Attorney, Agent, or Firm*—Trask, Britt & Rossa

[57] ABSTRACT

A semiconductor device including bond pads disposed proximate an edge thereof, and an overcoat layer. The overcoat layer defines notches around each of the bond pads. The overcoat layer may be formed from a photoimageable material such as a photoimageable epoxy. The invention also includes an alignment device that secures the semiconductor device perpendicularly upon a carrier substrate. The alignment device includes intermediate conductive elements which correspond to the bond pads of the semiconductor device. Upon insertion of the semiconductor device into the alignment device, the notches facilitate alignment of the bond pads with their corresponding intermediate conductive elements. The intermediate conductive elements establish an electrical connection between the semiconductor device and the carrier substrate.

44 Claims, 4 Drawing Sheets

SEMICONDUCTOR DEVICE INCLUDING COMBED BOND PAD OPENING, ASSEMBLIES AND METHODS

BACKGROUND OF THE INVENTION

1. Field of the Invention

The present invention relates to chip-on-board assemblies. Particularly, the present invention relates to bare and minimally packaged semiconductor devices which are mountable substantially perpendicularly to a circuit board. Preferably, each of the bond pads of the semiconductor device is disposed proximate a single edge of the semiconductor device. More particularly, the present invention relates to semiconductor devices which include a coating layer over at least a portion of the active surface thereof, which defines notches around the bond pads to impart support to the semiconductor device as it is disposed perpendicularly in relation to the substrate. The present invention also relates to devices for aligning semiconductor devices perpendicularly relative to a circuit board and for establishing electrical connections therebetween.

2. Background of Related Art

The direct attachment of a semiconductor device to a circuit board is known in the art as chip-on-board technology. Semiconductor devices that are directly mountable to a circuit board typically include bond pads adjacent more than one edge thereof or in an area array over the active surface thereof. Methods for attaching semiconductor devices directly to a circuit board include flip-chip technology and tape automated bonding. Typically, when such techniques are employed, a semiconductor device which includes bond pads on an active surface thereof is oriented over the circuit board and substantially parallel thereto in order to establish an electrical connection between the semiconductor device and the circuit board. After connecting such a semiconductor device to a circuit board, a protective coating may be applied over the semiconductor device.

However, the placement of a semiconductor device directly against a circuit board is somewhat undesirable in that, due to the parallel orientation of the semiconductor device relative to the circuit board and the typical placement of the semiconductor device's active surface against the circuit board, heat must pass through the carrier substrate or the semiconductor device in order to dissipate from the semiconductor device. Thus, the transfer of heat away from the semiconductor device is relatively slow. The horizontal orientation of the semiconductor device also consumes a great deal of area or "real estate" on the circuit board. Moreover, chip-on-board attachments are typically permanent, making them somewhat undesirable from the standpoint that they are not readily user-upgradable.

Vertical surface mount packages are also known in the art. When compared with traditional, horizontally mountable semiconductor packages and chip-on-board devices, many vertical surface mount packages have a superior ability to transfer heat away from the semiconductor device. Vertical surface mount packages also consume less area on a circuit board than a horizontally mounted package of the same size. Thus, many skilled individuals in the semiconductor industry are finding vertical surface mount packages more desirable than their traditional, horizontally mountable counterparts.

The following United States patents disclose various exemplary vertical surface mount packages: U.S. Pat. No. Re. 34,794, issued to Warren M. Farnworth on Nov. 22, 1994; U.S. Pat. No. 5,444,304, issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

Many vertical surface mount packages are somewhat undesirable in that they include leads which operatively connect a semiconductor device to a circuit board. The leads of such devices tend to increase the impedance and decrease the overall speed with which such devices conduct electrical signals. Moreover, the packaging of many such devices adds to their undesirability. Typically, packaging requires multiple additional manufacturing steps, which translates into increased production costs. The packaging of many vertical surface mount packages also tends to consume a substantial amount of area or "real estate" on the circuit board to which they are attached. However, a prevalent trend in the industry is to increase functionality while consuming less surface area on the circuit board. Further, some semiconductor device packages tend to inhibit the transfer of heat from the semiconductor device contained therein. Moreover, many vertical surface mount packages are not readily user-upgradable.

U.S. Pat. No. 5,593,927 (the "'927 patent"), issued to Warren M. Farnworth et al. on Jan. 14, 1997, discloses a method of minimally packaging semiconductor devices which includes forming a protective layer of glass, silicon nitride, silicon dioxide, or polyimide and additional conductive traces on the surface thereof. The thickness of such protective layers is in the range of only about 1 $\mu$m to 12.5 $\mu$m (½ mil), making them somewhat undesirable. When disposed on vertically mountable semiconductor devices, such protective layers would lend little or no support to the device. Similarly, when placed in a holder such as the one that is disclosed in the '927 patent, the protective layer is too thin to align electrical connectors of the holder with their corresponding bond pads on the semiconductor device.

Thus, a bare or minimally packaged, low-cost, alignable, vertically mountable semiconductor device which readily attaches to a circuit board is needed. There is also a need for a vertically mountable semiconductor device which is user-upgradable. A vertically mountable semiconductor device is also needed with reduced impedance and improved heat transferability.

SUMMARY OF THE INVENTION

The combed vertical mount semiconductor device according to the present invention addresses each of foregoing needs.

The semiconductor device assembly of the present invention includes a semiconductor device having a plurality of bond pads disposed proximate a single edge thereof. At least a portion of the active surface of the semiconductor device is coated with an overcoat layer, which defines a notch around each of the bond pads. Thus, each of the bond pads is exposed. The notches impart the edge of the semiconductor device with a combed appearance. The present invention also includes an alignment device, which attaches to a carrier substrate and includes a receptacle to orient and align the semiconductor device relative to the carrier substrate. Intermediate conductive elements in the receptacle electrically connect each of the bond pads to a corresponding terminal on the carrier substrate. Preferably, upon insertion of the semiconductor device into the alignment device, only a portion of the semiconductor device is disposed within the receptacle.

The present invention also includes a method of forming an overcoat layer on a semiconductor device, wherein the overcoat layer defines notches around the bond pads of a semiconductor device. Methods of designing the semiconductor device of the present invention and securing the semiconductor device to a carrier substrate are also within the scope of the present invention.

Advantages of the present invention will become apparent to those of ordinary skill in the art through a consideration of the appended drawings and the ensuing description.

DETAILED DESCRIPTION OF THE PREFERRED EMBODIMENTS

Figure 1A:
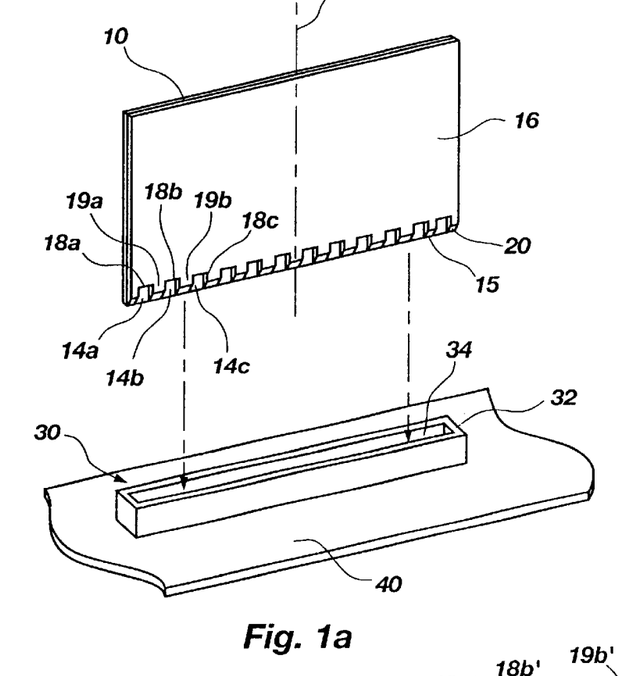
FIG. 1a is a perspective assembly view of the present invention, illustrating the semiconductor device, the alignment device and a carrier substrate.
Figure 1B:
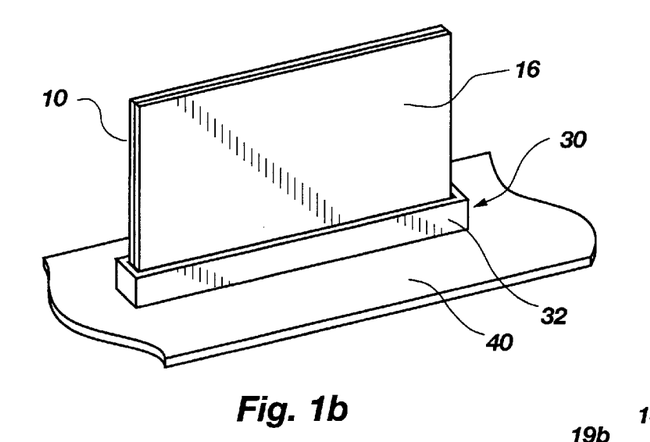
FIG. 1b is a perspective view of the assembly of FIG. 1a, illustrating the semiconductor device inserted into the alignment device.

With reference to FIGS. 1a and 1b, an assembly is shown which includes a semiconductor device 10 and an alignment device 30. Alignment device 30 is attachable to a carrier substrate 40, such as a printed circuit board (PCB). Semiconductor device 10 is insertable into alignment device 30, which orients the semiconductor device perpendicularly relative to carrier substrate 40.

Referring to FIG. 1a, semiconductor device 10 is a semiconductor device of the type known in the industry, which includes circuit traces and active elements. The bond pads 14a, 14b, 14c, etc. of semiconductor device 10 are disposed on an active surface of same, adjacent to a single edge 15 of the semiconductor device. Preferably, bond pads 14a, 14b, 14c, etc. are arranged in-line. Bond pads 14a, 14b, 14c, etc. may be disposed a short distance from edge 15, or their lower edges may be flush with edge 15. Thus, during fabrication of semiconductor device 10, bond pads 14a, 14b, 14c, etc. are erected to a location which is proximate edge 15. Processes which are known to those of ordinary skill in the art are useful for manufacturing semiconductor devices 10 which are useful in the package according to the present invention. Such processes include the formation of circuit traces which lead to edge 15 and the fabrication of bond pads 14a, 14b, 14c, etc. adjacent to edge 15. Preferably, the fabrication steps which precede the formation of the circuit traces that lead to bond pads 14a, 14b, 14c, etc. and the formation of the bond pads are unchanged from their equivalent steps in the fabrication of prior art semiconductor devices. Thus, existing semiconductor designs are useful in the assembly of the present invention with little or no modification.

A preferred semiconductor device 10 has a standardized number of bond pads 14a, 14b, 14c, etc., which are laterally spaced from one another at a standardized pitch, and which may be positioned at a specific location relative to a center line 22 of the semiconductor device, or relative to any other landmark on the semiconductor device, such as a side thereof. Alternatively, the number and pitch of bond pads 14a, 14b, 14c, etc. may be non-standardized. The placement of bond pads 14a, 14b, 14c, etc. proximate edge 15 imparts semiconductor device 10 with reduced impedance as the bond pads are electrically connected to carrier substrate 40, relative to many vertical surface mount packages and other packaged semiconductor devices in the prior art.

FIG. 1b illustrates a semiconductor device 10 interconnected with an alignment device 30 that has been secured to carrier substrate 40.

Figure 2A:
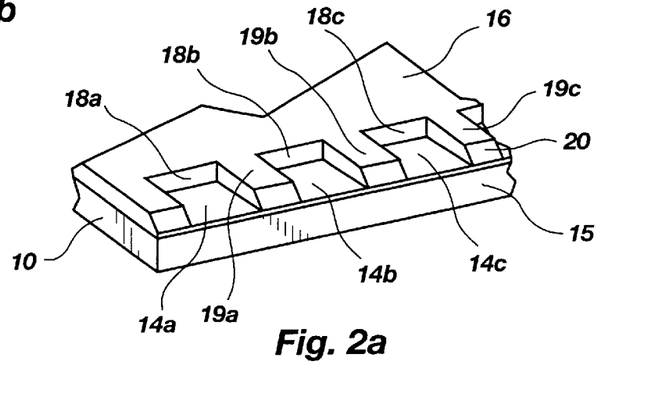
FIG. 2a is a partial perspective view of an edge of a first embodiment of the semiconductor device.

With reference to FIG. 2a, semiconductor device 10 includes an overcoat layer 16 disposed on the active surface thereof adjacent an edge 15 thereof. Overcoat layer 16 defines a notch 18a, 18b, 18c, etc. around each of bond pads 14a, 14b, 14c, etc. of semiconductor device 10 such that at least a portion of each of the bond pads is exposed. Overcoat layer 16 defines teeth 19a, 19b, 19c, etc. between adjacent notches 18a, 18b, 18c, etc. Upon insertion of device 10 into an alignment device (reference character 30 of FIG. 1a), as described in greater detail below, notches 18a, 18b, 18c etc. facilitate the alignment of bond pads 14a, 14b, 14c, etc. with respect to their corresponding terminals on the carrier substrate (reference character 40 of FIG. 1a). Preferably, overcoat layer 16 tapers toward edge 15 to form a bevel 20 to facilitate insertion of semiconductor device 10 into the alignment device.

Figure 2B:
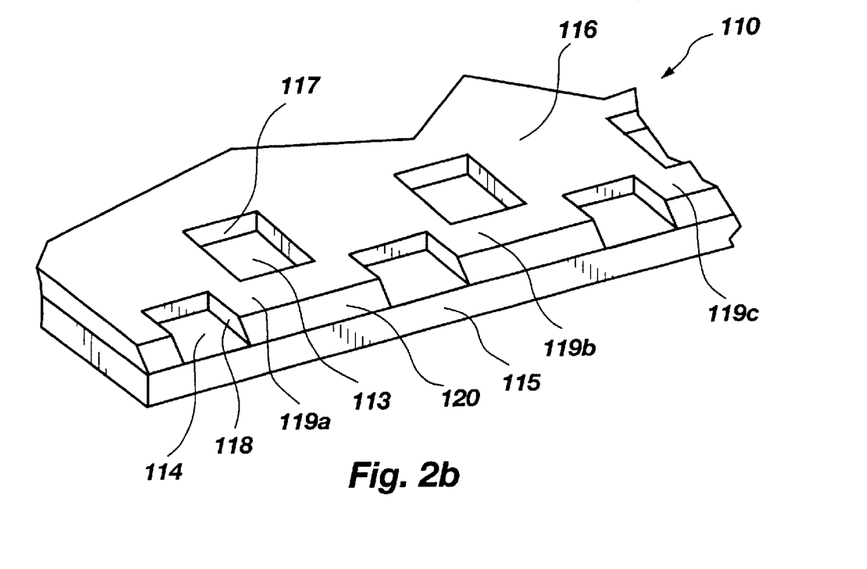
FIG. 2b is a partial perspective view of an edge of a second embodiment of the semiconductor device.

FIG. 2b illustrates a semiconductor device 110 which includes two rows of bond pads 113 and 114. The first row of bond pads 114 is located closer to edge 115 than the second row of bond pads 113. An overcoat layer 116 disposed over semiconductor device 110 defines two sets of notches 117 and 118. Notches 118, which are formed around bond pads 114, are located adjacent to edge 115 and open thereto. Notches 117 completely surround the perimeter of bond pads 113. Overcoat layer 116 also defines teeth 119a, 119b, 119c, etc., which are disposed between adjacent notches 118 and between notches 117 and edge 115. Overcoat layer 116 includes a bevel 120 formed adjacent to bottom edge 115 of semiconductor device 110. Bevel 120 facilitates the insertion of semiconductor device 110 into an alignment device (reference character 30 of FIG. 1a) and movement of the alignment device's intermediate conductive elements 35 (see FIGS. 5a and 5b) over teeth 119a, 119b, 119c, etc. to establish an electrical contact with bond pads 13. Further, teeth 119a, 119b, 119c, etc. protect the active surface of semiconductor device 110 from wear during insertion of the semiconductor device into or removal of the same from an alignment device (reference character 30 of FIG. 1a).

Figure 3:
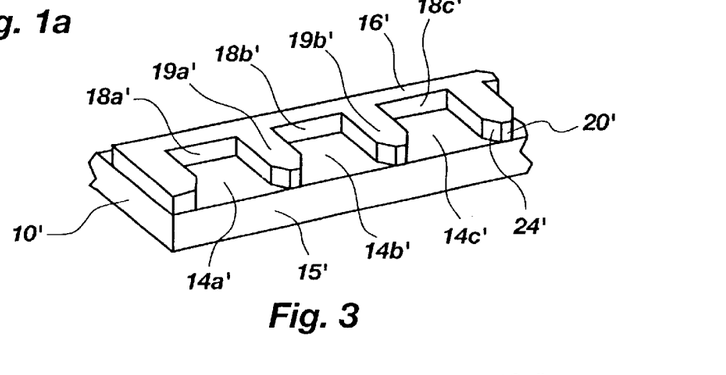
FIG. 3 is a partial perspective view of a third embodiment of the semiconductor device.

Referring now to FIG. 3, another variation of the overcoat layer 16' is depicted, wherein notches 18a', 18b', 18c', etc. each include an outward taper 24' at edge 15', giving teeth 19a', 19b', 19c', etc. a tapered end. Outward tapers 24' facilitate the alignment of intermediate conductive elements 35 (see FIGS. 5a and 5b) with bond pads 14a', 14b', 14c', etc.

Figure 4:
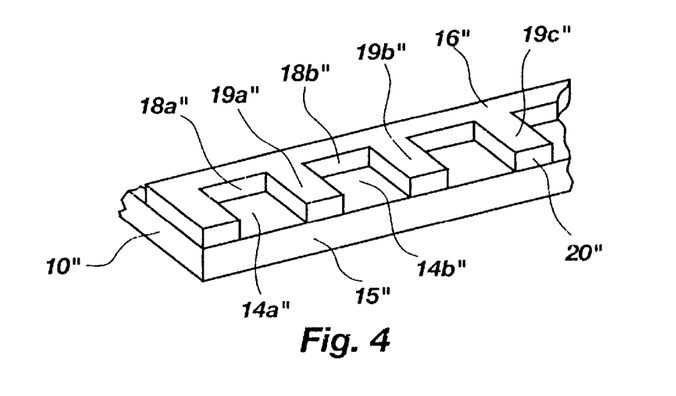
FIG. 4 is a partial perspective view of a fourth embodiment of the semiconductor device.

With reference to FIG. 4, another variation of the overcoat layer 16" is shown. Overcoat layer 16" has a substantially uniform thickness, imparting semiconductor device 10" with a squared bottom edge 15". Thus, teeth 19a", 19b", 19c", etc. include squared ends. Other variations of the overcoat layer may form teeth which include rounded ends between each of the bond pads or may define notches which totally surround the bond pads.

Overcoat layer 16 is preferably manufactured from a durable material which can be applied to a semiconductor device in a relatively thick layer (at least about one mil (25 $\mu$m) thick) and which may be formed into desired shapes of very fine resolution (i.e., about 1 $\mu$m and lower). Some photoimageable epoxies are useful as overcoat layer 16. One such material is the multi-functional glycidyl ether derivative of bisphenol-A novolac high-resolution negative photoresist available from Shell Chemical Company of Houston, Tex. under the trade name EPON® SU-8. EPON® SU-8 is a low molecular weight resin which is useful for fabricating structures having dimensions in the lower range of about 0.25 $\mu$m to about 0.10 $\mu$m. As employed in the present invention, however, the multi-functional glycidyl ether derivative of bisphenol-A novolac is useful for forming overcoat layers of up to about 250 $\mu$m (10 mils) thick. When combined with a photoinitiator, or promoter, the photoimageable epoxy forms a highly structured, cross-linked matrix. One such photoinitiator is triaryl sulfonium salt, which is available from Union Carbide Corporation of Danbury, Conn. under the trade name CYRACURE® UVI. That highly structured, cross-linked matrix may then be solvated in organic solvents such as gamma-butyrolactone, propylene glycol methyl ether acetate, and methyl isobutyl ketone. Other photoinitiators are also useful for forming such cross-linked matrices with multi-functional glycidyl ether derivatives of bisphenol-A novolac such as EPON® SU-8.

Upon solvation, a desired thickness of the photoresist-photoinitiator compound is applied to semiconductor device 10 by known methods, such as spin-coating or spraying. The semiconductor device 10 is then masked and cross-linked by exposure to radiation to create teeth 19 and notches 18. Radiation sources which are useful for cross-linking overcoat layers which include a multi-functional glycidyl ether derivative of bisphenol-A novolac include, without limitation, ultraviolet radiation, electron-beam radiation, and X-ray radiation. Due to the transparency of the multi-functional glycidyl ether derivative of bisphenol-A novolac that is useful in the present invention, photoimaging of overcoat layer 16 forms a substantially perpendicular angle at edge 15. Alternatively, other materials, including other ultraviolet, X-ray, electron-beam, and laser-imageable materials may be employed to form overcoat layer 16. For example, photoimageable polyimides and other photoimageable materials which are not fully transparent are useful for forming overcoat layers 16 with beveled edges. The excess material is then removed from the semiconductor device by known methods.

Figure 5A:
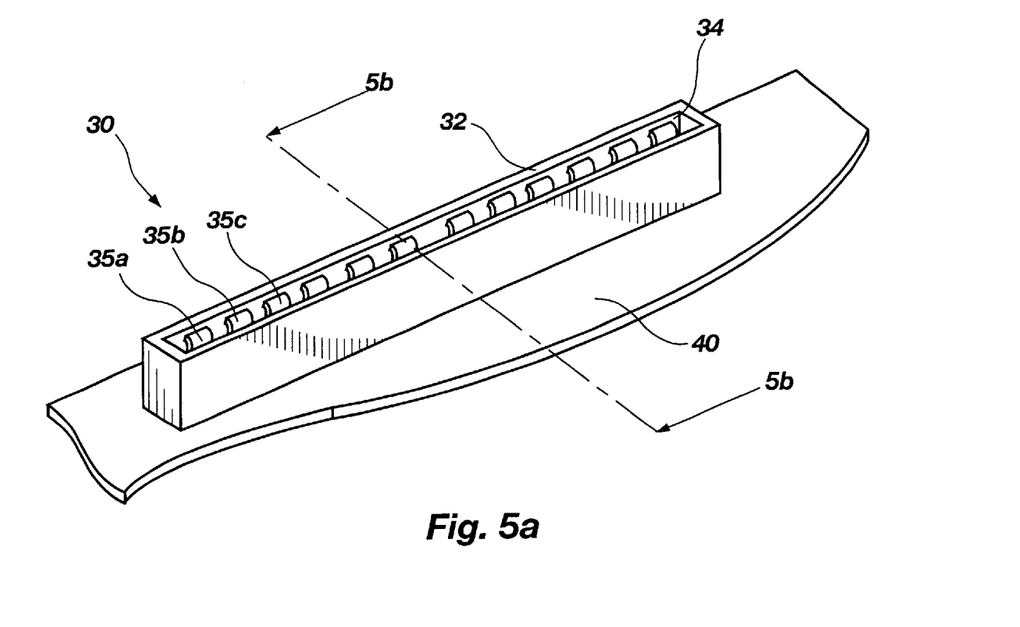
FIG. 5a is a perspective view of a preferred embodiment of an alignment device that is useful with the semiconductor device.
Figure 5B:
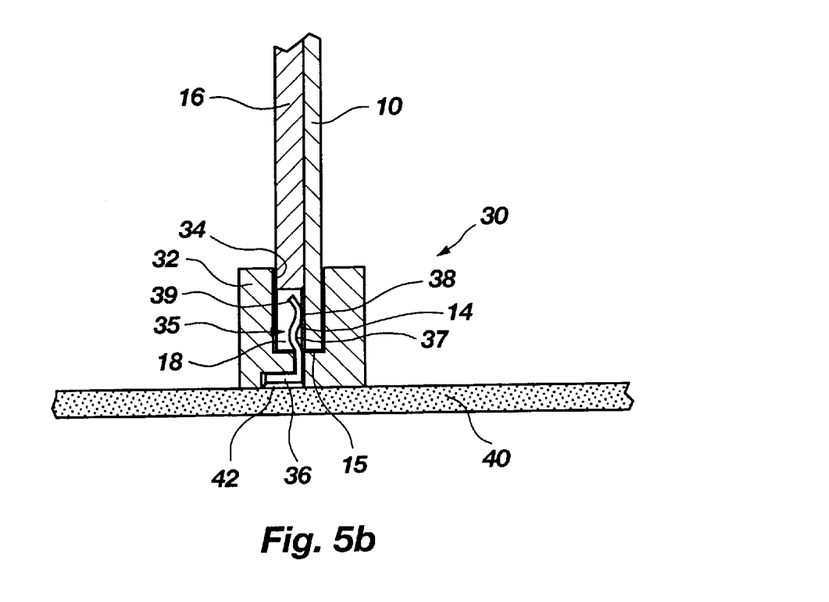
FIG. 5b is a cross-section taken along line 5b—5b of FIG. 5a, depicting the semiconductor device interconnected with the alignment device.

FIGS. 5a and 5b illustrate a first embodiment of an alignment device 30 which is useful in the vertical mount assembly of the present invention. Alignment device 30 includes a body 32 which defines a receptacle 34. Receptacle 34 extends downward through the top of alignment device 30. Intermediate conductive elements 35a, 35b, 35c, etc. are disposed in receptacle 34. Upon attachment of alignment device 30 to carrier substrate 40, intermediate conductive elements 35a, 35b, 35c, etc. are electrically connected to their corresponding terminals 42 on the carrier substrate, operatively connecting the alignment device to the carrier substrate.

Each intermediate conductive element 35 is an outwardly forcible, integral leaf spring which includes a terminal contact end 36, a spring arm 37 and a bond pad contact end 38. Terminal contact end 36 extends downward through body 32 to contact the terminal 42. Spring arm 37 extends upward into receptacle 34. Bond pad contact end 38 is adapted to abut a corresponding bond pad 14 upon insertion of edge 15 of semiconductor device 10 into receptacle 34. During the insertion of a semiconductor device 10 into receptacle 34, spring arm 37 is forced away from same. The reactive (i.e., spring) force of spring arm 37 forces bond pad contact end 38 against its corresponding bond pad 14 in order to establish an electrical contact between the bond pad contact end and the bond pad. Thus, intermediate conductive element 35 establishes an electrical connection between carrier substrate 40 and semiconductor device 10.

Intermediate conductive element 35 may include an outwardly bent extension above bond pad contact end 38, which is referred to as outward extension 39. Outward extension 39 facilitates movement of bond pad contact end 38 as a semiconductor device 10 is inserted into receptacle 34. The shape of outward extension 39 may also prevent damage to the semiconductor device and its bond pads 14 during insertion of same into receptacle 34.

Preferably, intermediate conductive elements 35 have a length of about 1½ mm (about 60 mils) or less. More preferably, intermediate conductive elements 35 are about 1 mm (about 40 mils) in length or shorter. As those in the art are aware, longer, larger wires create greater impedance. Thus, less impedance is generated by shorter intermediate conductive elements 35. The total length of intermediate conductive elements 35 depends on the thickness of the base of the alignment device, the length required to establish an electrical connection with a terminal on the carrier substrate, and the length required to establish an electrical connection with the bond pads of the semiconductor device.

Alternative variations of the alignment device may include a plurality of receptacles in either a serial arrangement or a matrix (i.e., rows and columns)-type arrangement. Another variation of the alignment device may include only one receptacle. In variations of the alignment device which include a plurality of receptacles, some of the receptacles may remain empty so that the computer or other device within which the invented assembly is installed may be upgraded in the future by inserting additional semiconductor devices into the empty receptacles. Alternatively, each of the receptacles of such multi-receptacle alignment devices may include a semiconductor device.

With continued reference to FIG. 5b, in use, alignment device 30 is mounted to carrier substrate 40. One or more of the semiconductor devices 10 are inserted into receptacle(s) 34. Intermediate conductive elements 35 exert sufficient force against their corresponding bond pads 14 (see FIG. 1a) on semiconductor device 10 to establish and maintain an electrical connection between the bond pads and their corresponding terminals 42 on carrier substrate 40. The resilient engagement of the semiconductor device 10 in alignment device 30 facilitates the ready removal of the semiconductor device 10 therefrom. Consequently, each semiconductor device 10 is readily removable from receptacle 34 and may also be readily replaced therein.

Figure 6:
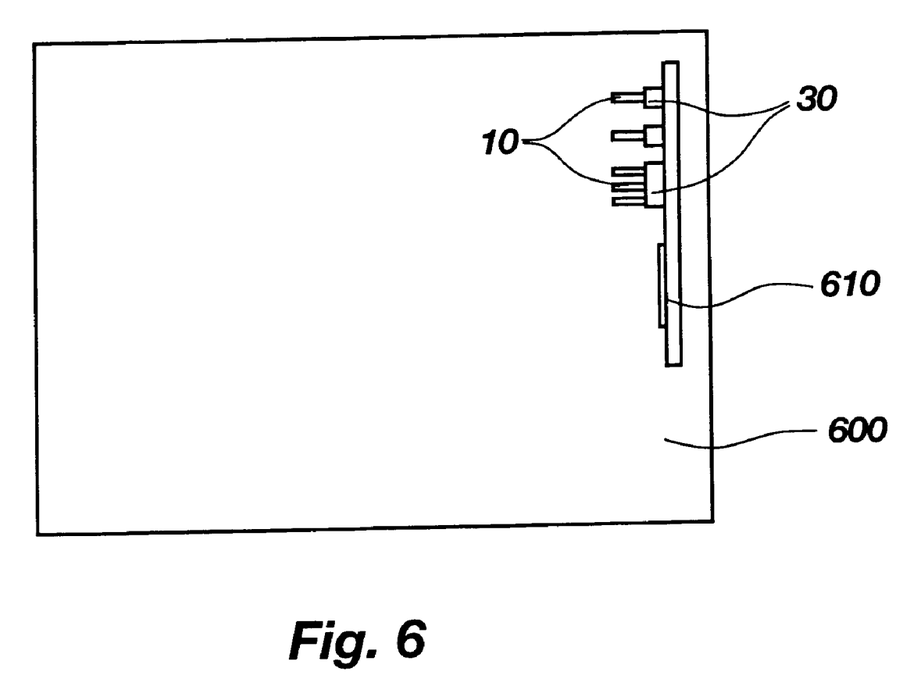
FIG. 6 is a schematic representation of the semiconductor device in a computer.

FIG. 6 depicts a computer 600 which includes a carrier substrate 610 therein. Alignment device 30, which includes one or more invented semiconductor devices 10 disposed therein, is attached to carrier substrate 610. Intermediate conductive elements 35 (see FIG. 5b) abut bond pads (not shown) on the semiconductor device 10 to establish and maintain an electrical connection between the semiconductor device and carrier substrate 610. Thus, the semiconductor device(s) is (are) operatively associated with computer 600.

The features of the semiconductor device, the alignment device, and the assembly of the present invention provide several advantages over many semiconductor devices and assemblies in the prior art. First, the alignment device of the present invention includes short intermediate conductive elements which establish an operative connection between the bond pads of the semiconductor device and their corresponding terminals on the carrier substrate. Consequently, the assembly has relatively low impedance when compared with many semiconductor devices and assemblies in the prior art. Second, the alignment device of the present invention includes intermediate conductive elements which resiliently establish an interference fit-type electrical connection between the semiconductor device and a carrier substrate, and engage the semiconductor device of the present invention. Advantageously, the assembly of the present invention is readily user-upgradable. Moreover, the substantially vertical orientation of the semiconductor device in the assembly facilitates heat removal therefrom and consumes relatively little area or "real estate" on the carrier substrate.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions and modifications to the invention as disclosed herein which fall within the meaning and scope of the claims are embraced within their scope.

What is claimed is:

1. A semiconductor device which is vertically mountable to a carrier substrate, comprising:
    an active surface including an edge and a bond pad disposed proximate said edge; and
    an overcoat layer disposed on said active surface adjacent to said edge, said overcoat layer defining a notch around said bond pad such that at least a portion of said bond pad is exposed.

2. The semiconductor device of claim 1, wherein said overcoat layer tapers toward said edge to define a bevel adjacent said edge.

3. The semiconductor device of claim 1, wherein said overcoat layer defines an outward taper on said notch proximate said edge.

4. The semiconductor device of claim 1, wherein said overcoat layer covers substantially all of said active surface.

5. The semiconductor device of claim 1, wherein said notch completely surrounds said bond pad.

6. The semiconductor device of claim 1, wherein said active surface includes a plurality of bond pads.

7. The semiconductor device of claim 6, wherein selected ones of said bond pads are disposed proximate a single edge.

8. The semiconductor device of claim 1, wherein said overcoat layer defines a tooth between adjacent bond pads.

9. The semiconductor device of claim 1, wherein said overcoat layer is at least about one mil thick.

10. A vertically mountable bare semiconductor device, comprising:

an active surface including a plurality of bond pads disposed along an edge thereof;
    an overcoat layer disposed over said active surface proximate said edge; and
    a plurality of notches defined by said overcoat layer, each of said notches exposing one of said bond pads.

11. The vertically mountable semiconductor device of claim 10, further comprising a tooth defined by said overcoat layer between each pair of adjacent notches.

12. The vertically mountable semiconductor device of claim 10, wherein said overcoat layer tapers toward said edge to define a bevel adjacent said edge.

13. The vertically mountable semiconductor device of claim 10, wherein said overcoat layer defines an outward taper on selected ones of said notches proximate said edge.

14. The vertically mountable semiconductor device of claim 10, wherein said overcoat layer covers substantially all of said active surface.

15. The vertically mountable semiconductor device of claim 10, wherein said notches completely surround said bond pads.

16. The vertically mountable semiconductor device of claim 10, wherein said overcoat layer is at least about 1 mil thick.

17. An assembly for vertically mounting a semiconductor device relative to a carrier substrate, comprising:

a semiconductor device including an active surface, a bottom edge, a bond pad disposed proximate said bottom edge and an overcoat layer disposed on said active surface proximate said bottom edge, said overcoat layer defining a notch around said bond pad such that at least a portion of said bond pad is exposed; and
    an alignment device attachable to the carrier substrate.

18. The assembly of claim 17, wherein said overcoat layer defines an outward taper on said notch proximate said bottom edge.

19. The assembly of claim 17, wherein said notch tapers outward proximate to said bottom edge of said semiconductor device.

20. The assembly of claim 17, wherein said overcoat layer covers substantially all of said active surface of said semiconductor device.

21. The assembly of claim 17, wherein said notch completely surrounds said bond pad of said semiconductor device.

22. The assembly of claim 17, wherein said active surface of said semiconductor device includes a plurality of bond pads.

23. The assembly of claim 22, wherein said plurality of said bond pads is disposed proximate a single edge of said semiconductor device.

24. The assembly of claim 23, wherein said overcoat layer of said semiconductor device defines a tooth between adjacent bond pads.

25. The assembly of claim 17, wherein said alignment device includes a body which defines a receptacle.

26. The assembly of claim 17, wherein said alignment device comprises an intermediate conductive element which, upon interconnection of said semiconductor device and said alignment device, resiliently engages said bond pad.

27. The assembly of claim 26, wherein said intermediate conductive element, upon interconnection of said semiconductor device and said alignment device, secures said semiconductor device relative to said alignment device.

28. The assembly of claim 17, wherein said overcoat layer is at least about 1 mil thick.

29. A chip-on-board assembly, comprising:

a semiconductor device including an active surface, a bottom edge, a bond pad disposed proximate said bottom edge and an overcoat layer disposed on said active surface proximate said bottom edge, said overcoat layer defining a notch around said bond pad such that at least a portion of said bond pad is exposed; and an alignment device including a body which defines a receptacle, said alignment device being attachable to a carrier substrate.

30. The assembly of claim 29, wherein said alignment device comprises an intermediate conductive element which, upon interconnection of said semiconductor device and said alignment device, resiliently engages said bond pad.

31. The assembly of claim 29, wherein said alignment device, upon interconnection of said semiconductor device and said alignment device, secures said semiconductor device relative to said alignment device.

32. A computer including a vertically mountable semiconductor device, the semiconductor device comprising:

an active surface including an edge and a bond pad disposed proximate said edge; and an overcoat layer disposed on said active surface adjacent said edge, said overcoat layer defining a notch around said bond pad such that at least a portion of said bond pad is exposed.

33. The computer of claim 32, wherein said overcoat layer tapers toward said edge to define a bevel.

34. The computer of claim 32, wherein said overcoat layer defines an outward taper on said notch proximate said edge.

35. The computer of claim 32, wherein said overcoat layer covers substantially all of said active surface.

36. The computer of claim 32, wherein said notch completely surrounds said bond pad.

37. A computer comprising:

a carrier substrate;

an alignment device including a body defining a receptacle and an intermediate conductive element disposed within said receptacle, said alignment device being attached to said carrier substrate; and a semiconductor device including a bond pad disposed proximate an edge thereof and an overcoat layer defining a notch around said bond pad, said edge being disposed within said receptacle of said alignment device.

38. The computer of claim 37, wherein said intermediate conductive element of said alignment device abuts said bond pad and is operatively connected thereto.

39. The computer of claim 37, wherein said intermediate conductive element of said alignment device resiliently engages said semiconductor device.

40. A method of packaging a semiconductor device, comprising:

applying a layer of an overcoat material to the semiconductor device to form an overcoat layer; and defining a notch in said overcoat layer around a bond pad of the semiconductor device.

41. The method of claim 40, wherein said overcoat material comprises a photoimageable material.

42. The method of claim 41, wherein said photoimageable material comprises a photoimageable epoxy.

43. The method of claim 42, wherein said photoimageable epoxy comprises a multi-functional glycidyl ether derivative of bisphenol-A novolac.

44. The method of claim 41, wherein said defining includes masking and irradiating the overcoat layer.

* * * * *

UNITED STATES PATENT AND TRADEMARK OFFICE
CERTIFICATE OF CORRECTION

| | | |
|---|---|---|
| PATENT NO. | : 5,940,277 | Page 1 of 1 |
| DATED | : August 17, 1999 | |
| INVENTOR(S) | : Warren M. Farnworth, Walter L. Moden and Larry D. Kinsman | |

It is certified that error appears in the above-identified patent and that said Letters Patent is hereby corrected as shown below:

Column 3,
Line 58, change "erected" to -- redirected --

Column 4,
Line 49, delete "bottom"
Line 55, change "13" to -- 113 --

Signed and Sealed this

Twenty-third Day of September, 2003

JAMES E. ROGAN
*Director of the United States Patent and Trademark Office*